United States Patent [19]

Fiedler et al.

[11] Patent Number: 4,580,137
[45] Date of Patent: Apr. 1, 1986

[54] LSSD-TESTABLE D-TYPE EDGE-TRIGGER-OPERABLE LATCH WITH OVERRIDING SET/RESET ASYNCHRONOUS CONTROL

[75] Inventors: Timothy S. Fiedler, Endwell; Richard P. Moore, Apalachin, both of N.Y.

[73] Assignee: International Business Machines Corporation, Armonk, N.Y.

[21] Appl. No.: 527,537

[22] Filed: Aug. 29, 1983

[51] Int. Cl.$^4$ ............................................. H04Q 9/00
[52] U.S. Cl. ........................... 340/825.68; 307/272 R; 307/480; 371/25; 377/81; 340/825.02
[58] Field of Search ....................... 340/825.02, 825.68; 307/480, 272 R; 371/25; 377/81; 324/73 AT, 57 DT

[56] References Cited

U.S. PATENT DOCUMENTS

| | | | |
|---|---|---|---|
| 3,761,695 | 9/1973 | Eichelberger | 235/153 AC |
| 3,783,254 | 1/1974 | Eichelberger | 235/152 |
| 3,784,907 | 1/1974 | Eichelberger | 324/57 DE |
| 4,006,492 | 2/1977 | Eichelberger et al. | 357/45 |
| 4,051,352 | 9/1977 | Eichelberger et al. | 364/716 |
| 4,063,078 | 12/1977 | Gupta et al. | 364/700 |
| 4,063,080 | 12/1977 | Eichelberger et al. | 235/302 |
| 4,277,699 | 7/1981 | Brown et al. | 307/272 R |
| 4,298,980 | 11/1981 | Hajdu et al. | 371/25 |
| 4,477,738 | 10/1984 | Kouba | 307/480 |
| 4,513,283 | 4/1985 | Leininger et al. | 340/825.02 |
| 4,535,467 | 8/1985 | Davis et al. | 307/272 R |

OTHER PUBLICATIONS

"Set/Reset Shift Register Latch", D. E. Gates et al., IBM Technical Disclosure Bulletin, vol. 21, No. 10, Mar. 1979, p. 4166.
"Power Saving Latch", E. L. Carter, IBM Technical Disclosure Bulletin, vol. 22, No. 08B, Jan. 1980, pp. 3658–3660.
"Edge-Triggered Latch Design", R. A. Johnson, IBM Technical Disclosure Bulletin, vol. 23, No. 5, Oct. 1980, pp. 2013–2014.
"Level Sensitive Scan Design Testable Asynchronous Set/Reset Latch", F. G. Anders et al., IBM Technical Disclosure Bulletin, vol. 24, No. 02, Jul. 1981, pp. 1038–1039.
"LSSD Compatible D-Function Latch", F. J. Canova et al., IBM Technical Disclosure Bulletin, vol. 25, No. 10, Mar. 1983, pp. 5196–5198.
"The TTL Data Book for Design Engineers", 2nd Edition, (1976), Texas Instruments Inc., pp. 5–22.
"Digital Logic and Computer Design", M. M. Mano, Prentice-Hall, Inc., (1979), Chapter 6, pp. 202–255, and FIGS. 6–12, p. 214.
"Digital Computer Electronics: An Introduction to Microcomputers", A. P. Malvano, 2nd Edition, McGraw-Hill, Inc., (1983), Chapter 7, pp. 90–105.
"Testing Logic Networks and Designing for Testability", T. W. Williams et al., Computer, Oct. 1979, pp. 9–21.

Primary Examiner—Donald J. Yusko
Attorney, Agent, or Firm—Norman R. Bardales

[57] ABSTRACT

A LSSD testable latch circuit apparatus is disclosed which has systems operational and LSSD testing operational modes. The apparatus is arranged with first and second groups of flip-flops, each group having three flip-flops. Control means allows for selective operation of the first group of flop-flops as a D-type edge triggered latch during the systems operational mode and of the first and second groups as a three-stage shift register during the LSSD testing operational mode. The control means also allows the D-type edge-triggered latch to have override asynchronously set and/or reset control.

15 Claims, 5 Drawing Figures

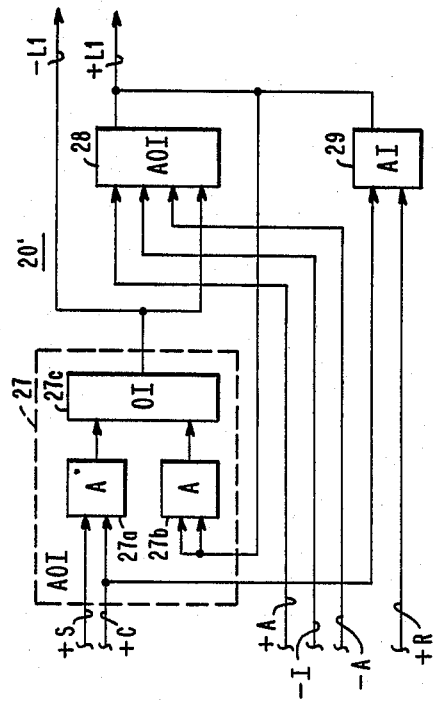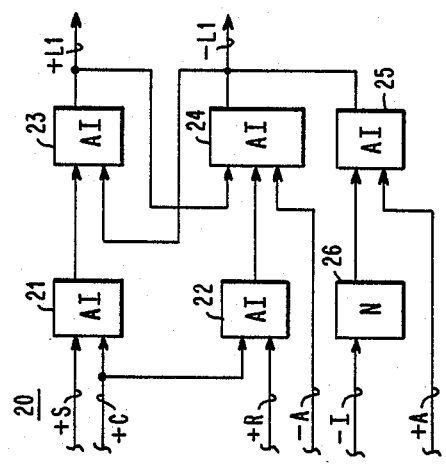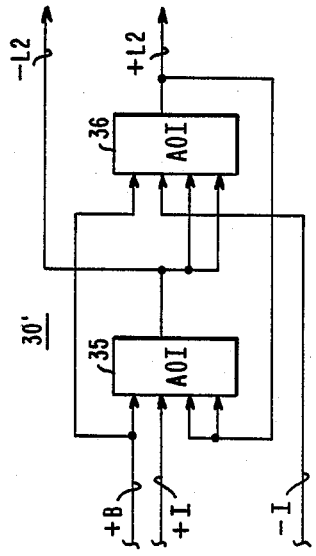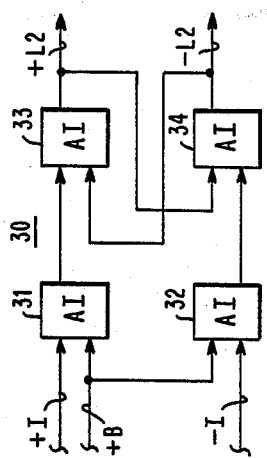

LSSD-TESTABLE D-TYPE EDGE-TRIGGER-OPERABLE LATCH WITH OVERRIDING SET/RESET ASYNCHRONOUS CONTROL

CROSS REFERENCE TO RELATED APPLICATIONS

In copending patent applications Ser. Nos. 445,599 (now U.S. Pat. No. 4,513,283) and 445,601 (now U.S. Pat. No. 4,535,637, entitled "Switch Logic For Shift Register Latch Pair"), concurrently, filed Nov. 30, 1982, and entitled respectively "Latch Circuits With Differential Cascode Current Switch Logic" and "Merged L1/L2 Bistable Devices For LSSD", J. C. Leininger and J. W. Davis et al., respectively, and both assigned to the common assignee herein, there are described latch circuits and arrangements, respectively, which are compatible with level sensitive scan design (LSSD) testing rules. However, neither of these two copending applications discloses a LSSD testable latch circuit which is selectively operable as a D-type edge triggered latch that has overriding set/reset asynchronous control and/or as a three-stage shift register latch.

BACKGROUND OF THE INVENTION

1. Field of the Invention

This invention relates to a LSSD testable latch circuit and more particularly to a LSSD testable latch circuit that is selectively operable as a D-type edge trigger latch during systems operation and as a three stage shift register during testing and/or that has overriding set/reset asynchronous control for the D-type edge trigger latch.

2. Description of the Prior Art

As is well known to those skilled in the art, the momentary change in the input signal by which the state of a flip-flop is switched is referred to as a trigger, and the transition it causes is said to trigger the flip-flop. Asynchronous sequential flip-flop circuits, referred to in the art simply as asynchronous flip-flops, are triggered by a change of signal level. Synchronous sequential flip-flop circuits, referred to in the art as simply clocked flip-flops, are triggered by clock pulses. In a type of triggering known as level triggering, the output of the clocked flip-flop can change any time the clock is in its active level, which may be its high or low level depending upon whether positive level clocking or negative level clocking, respectively, is employed. Level triggered clocked flip-flops are sensitive to the clock pulse duration. To mitigate the well known timing problems associated with level triggering, it is considered generally better practice in the art to use clocked flip-flops which are sensitive to the transition of an input pulse rather than the pulse duration.

Examples of clocked flip-flops sensitive to pulse transition are master-slave flip-flops and edge-triggered flip-flops. A master-slave flip-flop is a combination of two cascaded clocked flip-flops called the master latch and the slave latch. The master latch is cocked during the active level of the clock and the slave latch is triggered during the transition of the clock to its inactive level. However, as is apparent to those skilled in the art, the output of the master latch can change any time the input clock is in its active level and hence the master latch is in a sense sensitive to the time duration of the input clock.

In an edge-triggered flip-flop, output transitions occur at a specific threshold level of the clock pulse; and, when the clock pulse exceeds the threshold level, the inputs are locked out and as a result the flip-flop is unresponsive to further changes in inputs until the clock pulse returns to its inactive level and another clock pulse occurs. In a D-type edge triggered flip-flop, when the D input is sampled by a clock pulse at the clock input, the resultant next state of the flip-flop is the same as the D input and independent of the present state of the flip-flop.

Certain commercially available integrated circuit (IC) flip-flop packages provide special inputs for setting or clearing a clocked flip-flop asynchronously and the inputs are referred to in the art as direct preset or direct clear. One such IC package, for example, is the SN7474 dual D-type positive-edge-triggered flip-flop, cf. "The TTL Data Book for Design Engineers", 2nd Edition, (1976), Texas Instruments Inc., page 5–22.

With the advent of large scale and/or very large scale integrated (LSI and/or VLSI) circuit technologies and the logic networks embodied therein, adequate testing of the logic network at the various manufacturing and packaging levels, e.g. component, chip, module, board, or system levels, as well as is in the field testing, requires complex testing technologies, and hence the logic networks must now be designed for testability which is compatible with the selected testing technology. One such testing technology is referred to in the art as level sensitive scan design (LSSD) testing. It has been recognized that it is desirable to have shift register latches (SRLs) which are implementable in VSLI and conform to LSSD rules, and in particular to have an SRL implementable in VLSI that conforms to LSSD rules and is operable as a D-type edge triggered latch, cf. U.S. Pat. No. 4,277,699, "Latch Circuit Operable As A D-Type Edge Trigger", D. J. Brown et al. and assigned to the common assignee herein. As is discussed in U.S. Pat. No. 4,277,699, because of their feedback configuration, D-type edge conventional triggers are very difficult to test by automatic test pattern generation without using additional input/output (I/O) terminals, and/or because such conventional triggers cannot conform to LSSD rules.

As described in the Brown et al. patent, the SRL thereof has a polarity hold latch connected to a set/reset latch. The polarity hold latch and set/reset latch are clocked by independent positive clock pulse trains, designated +C and +B, respectively, applied to an input of the polarity hold latch and set/reset latch, respectively. The clock pulses +C are derived through an inverter from complementary negative clock pulses −C, which are also fed to another input of the polarity hold latch. In addition, the polarity hold latch has another input to which another set of clock pulses designated A are fed. The three sets of clock pulses A, B and C are non-overlapping. To LSSD test the SRL, the clock C is used to set conditions, e.g. a fault effect condition, into the polarity hold latch, and then test patterns are fed to another input of the polarity hold latch designated as SCAN IN and the fault effect condition is scanned through the SRL to an observation point, i.e. terminal, in conjunction with the A and B clocks, the C clock not being used during the scanning.

As further described in the Brown et al patent, during systems operation, that is when the SRL is being used as a D-type edge trigger, the +B clock input of the set/reset latch is intraconnected to the −C clock input of the polarity hold latch. System data is fed to another input input of the polarity hold latch designated DATA and is clocked under the control of the +C clock. The A clock is not used. After a negative edge of the −C clock, the polarity hold latch follows the data input while the set/reset latch remains unchanged. On the next positive going edge of the −C clock signal, the information in the polarity hold latch is transferred to the set/reset latch.

In practice, the LSSD testing of the SRL circuit per se of the Brown et al patent is done prior to the intraconnection of the +B and −C clock inputs as aforedescribed, i.e. the intraconnection by which the SRL is made operable as a D-type edge trigger during systems operation. Since there can be literally hundreds of the SRL circuits on each chip, a corresponding number of individual pair of access inputs are needed to test each SRL individually. Furthermore, once the individual SRL circuits were tested, the aforedescribed intraconnection required to be made for each SRL in practice was a fixed one and thereby precluded LSSD testing or retesting of the individual SRL circuit per se, i.e. in the manner that it was done prior to the intraconnection, if the interconnection was not removed.

Alternatively, if a transistor switch is employed to intraconnect the inputs +B and −C of the Brown et al patent, it would require additional logic control for the transistor switches. For LSSD testing, the logic control input would be set to a given binary state which represents that the SRL is now configured for LSSD testing. The other binary state represents that the SRL is configured for system operation, and hence cannot be LSSD tested. Thus, for LSSD testing, fault effects for the aforementioned other binary state of the logic control input cannot be generated because it would provide meaningless LSSD test results. Any testing for the other binary state to the control logic input must consequently be done with other non-automatic LSSD test patterns and hence for the case of the transistor switch of the Brown et al. patent the system thereof is not fully testable through automatically generated test patterns.

Generally, the intraconnections were made subsequent to the interconnections made between the plural SRLs of the chip. The interconnections personalized the chip into one or more groups of larger circuits such as the Johnson counter described in Brown et al. Thereafter, the groups of larger circuits of the chip were tested in accordance with LSSD procedures. For the particular Johnson counter application and other similar applications, the interconnection of the SRLs of the group was amenable to using only two I/O terminals for the clock inputs of the entire group of SRLs making up the counter. However, in other applications, it is often required that a unique triggering signal, i.e. clock signal, be provided for each edge triggered SRL. It can be shown that in these other applications, the Brown et al SRL would require for each edge triggered latch three additional I/O terminals, i.e one each for the +B and −C clocks, and one for the output of the circuit which provides the triggering signal to be fed to the control inputs of the +B and −C clocks after test.

Moreover, in the case of the LSSD testing of the Brown et al individual SRLs subsequent to the intraconnection being made and/or in the case of system operation, the capability of conditioning of the individual SRL or a group of interconnected SRLs, as the case might be, to insure the individual SRL or the SRLs of the group were in a desired predetermined state, i.e. a 1 or a 0, were complex and/or not readily available and/or unreliable. This capability is particularly necessary when dealing with asynchronous events that do not occur with a definitive timing relationship with the clock signals, e.g. start up, and is particularly more acute in high speed applications.

Of the SRLs operable as edge type triggers in LSSD systems of which we are aware, such as, for example, the multiple clock signals and multiple latch combination SRL of the aforementioned U.S. Pat. No. 4,277,699 or the single clock pulse and single latch SRL of the publication entitled "Edge-Triggered Latch Design", R. A. Johnson, IBM Technical Disclosure Bulletin (TDB), Vol. 23, No. 5, October 1980, pp 2013-2014, none have asynchronous overriding set/reset control. Moreover, while the Johnson SRL arrangement requires only one clock and latch, it should be understood that there is still a need in LSSD systems for SRLs operable as edge-triggers which employ multiple latch combinations and/or multiple clocks, and that the present invention is directed to such needs.

It should also be understood that other types of clocked flip-flop arrangements in LSSD systems are known in the prior art, but these to our knowledge have been time duration sensitive, i.e. of the types employing level triggering where the output of the clocked flip-flop can change any time the clock is in its active level. Thus, for example, the latches of U.S. Pat. No. 3,783,254, "Level Sensitive Logic System", E. B. Eichelberger, and assigned to the common assignee herein, are clocked types which are sensitive to time durations of the clock pulses and hence are not sensitive to pulse transition and/or do not have overriding asynchronous set/reset control. Other examples, are the set/reset (SR) types, such as, for example, the shift register latch (SRL) described in the publication entitled "Set/Reset Shift Register Latch", D. E. Gates et al., IBM TDB, Vol. 21, No. 10, March 1979, p 4166, that is capable of being set and reset asynchronously, but which, however, requires the system clock thereof to be active to allow either the set or reset to be effective. Likewise, the clocked flip-flop described in the publication entitled "Level Sensitive Scan Design Testable Asynchronous Set/Reset Latch", F. G. Anders et al., IBM TDB, Vol. 24, No. 2, July 1981, pp 1038-1039, and those described in the aforementioned two copending patent applications are also SR types and are time duration sensitive. Clocked flip-flops of the master-slave type are described in U.S. Pat. No. 4,298,980, "LSI Circuitry Conforming To Level Sensitive Scan Design (LSSD) Rules And Method Of Testing Same", Hajdu et al., and assigned to the common assignee herein; and in the publication entitled "Power Saving Latch", E. L. Carter, IBM TDB, Vol. 22, No. 8B, January 1980, pp 3658-3660, and as such the respective master latches thereof are time duration sensitive as previously explained.

For further information regarding asynchronous flip-flops and clocked flip-flops in general and edge-triggered flip-flops in particular, reference may be made, for example, to the following, to wit: "Digital Logic And Computer Design", M. M. Mano, Prentice-Hall, Inc., 1979, Chapter 6, pp 202-255, and FIGS. 6-12 (D-type positive-edge-triggered flip-flop), p 214; and "Digital Computer Electronics: An Introduction To Microcomputers", A. P. Malvano, Second Edition, McGraw-Hill, Inc., 1983, Chapter 7, pp 90-105.

For further information regarding level sensitive scan design (LSSD) and/or LSSD testing of VLSI, reference may be made, for example, to the following, to wit: "Testing Logic Networks and Designing for Testability", T. E. Williams et al., Computer, October 1979, pp 9–21, and U.S. Pat. Nos. 3,761,695, 3,783,254, 3,784,907, 4,006,492 4,051,352, 4,051,353, 4,063,078 and 4,063,080, all assigned to the common assignee herein.

SUMMARY OF THE INVENTION

It is an object of this invention to provide latch circuit apparatus which is interchangeably operable as a D-Type edge-triggered latch for normal operational purposes and as a three stage shift register for LSSD testing purposes.

It is an object of this invention to provide LSSD-testable D-Type edge-trigger-operable latch circuit apparatus of the aforementioned kind with overriding set/reset asynchronous control.

Still another object of this invention is to provide latch circuit apparatus of the aforementioned kind which minimizes the number of access inputs required to test the circuit apparatus and/or simplifies the interconnection and testing thereof.

According to one aspect of the present invention, there is provided LSSD testable latch circuit apparatus which has systems operational and LSSD testing operational modes. The apparatus is arranged with first and second groups of flip-flops, each group having three flip-flops. Also provided are circuit control means for selectively operating the first group of flop-flops as a D-type edge triggered latch during the systems operational mode and operating the first and second groups as a three-stage shift register during the LSSD testing operational mode.

According to another aspect, the D-type edge triggered latch is further asynchronously settable and/or resettable by the circuit control means in an override manner.

The foregoing and other objects, features and advantages of the invention will be apparent from the more particular description of the preferred embodiments of the invention, as illustrated in the accompanying drawing.

BRIEF DESCRIPTION OF THE DRAWING

FIG. 2 is a schematic diagram shown in block form of a preferred embodiment of the L1 type flip-flop used in the circuit apparatus of FIG. 1;

FIG. 3 is a schematic diagram shown in block form of a preferred embodiment of the L2 type flip-flop used in the circuit apparatus of FIG. 1;

FIG. 4 is a schematic diagram shown in block form of another preferred embodiment of the L1 type flip-flop used in the circuit apparatus of FIG. 1; and FIG. 5 is a schematic diagram shown in block form of another preferred embodiment of the L2 type flip-flop used in the circuit apparatus of FIG. 1.

In the figures, like elements are designated with similar reference numbers.

DESCRIPTION OF THE PREFERRED EMBODIMENTS

Figure 1:
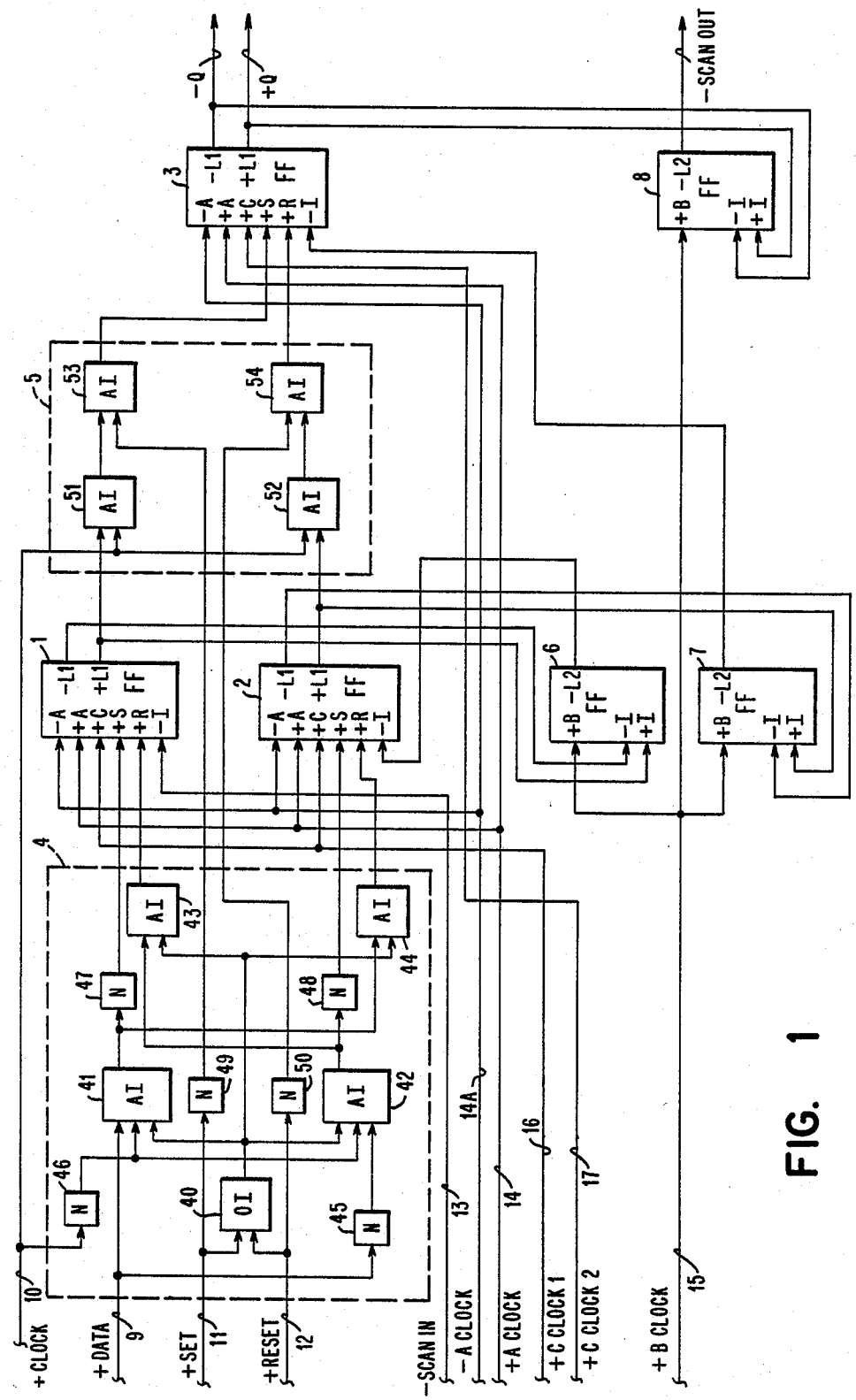
FIG. 1 is a schematic diagram shown in block form illustrating a preferred embodiment of the SRL circuit apparatus of the present invention.

Referring to FIG. 1, there is shown a preferred embodiment of the LSSD testable latch circuit apparatus of the present invention which is interchangeably operable as a D-type edge trigger latch during systems operation and as a three stage shift register during LSSD testing operations. The circuit when operating as a D-type edge trigger latch uses the group of three flip-flops 1–3 and the control means therefor, to wit: logic circuits 4 and 5. In addition, the circuit when operating as a three stage shift register uses in conjunction with the circuitry 1–5 thereof a second group of three flip-flops 6–8. Each stage uses a pair of flip-flops, one from each group, to wit: the pair of flip-flops 1 and 6 of the first or input stage, the pair of flip-flops 2 and 7 of the second stage, and the pair of flip-flops 3 and 8 of the third or output stage, each stage thus constituting a single shift register latch (SRL). For sake of clarity, the flip-flops 1–3 and 6–8 of the first and second groups, respectively, are sometimes herein referred to as L1 types and L2 types, respectively. Preferably, flip-flops of the same type are identical.

Input logic circuit 4 is connected to the set and reset inputs +S and +R, respectively, of the input flip-flops 1 and 2. The other logic circuit 5 is connected between the true outputs +L1 of flip-flops 1 and 2 to the set and reset inputs +S and +R of the output flip-flop 3. As explained hereinafter, during systems operation, the flip-flops 6–8 are substantially inactive, i.e. inhibited, and flip-flops 1–3 in conjunction with control circuits 4 and 5 coact to operate collectively as a D-type edge triggered latch; whereas, during the testing operation, flip-flops 6–8 are activated and in conjunction with the flip-flops 1–3 and control circuits 4–5 coact to operate as a shift register for testing purposes in accordance with LSSD rules and principles.

Referring to FIG. 1, in general the output of an L1 type flip-flop is connected to the shift-in input, also sometimes referred to herein as the scan-in input, of an L2 type flip-flop, and the output of an L2 type is connected to the scan-in input of an L1 type flip-flop. Thus, in FIG. 1, the true and complementary outputs +L1 and −L1, respectively, of flip-flop 1 are connected to the shift-in inputs +I and −I, respectively, of flip-flop 6. Likewise, the true and complementary outputs +L1 and −L1, respectively, of flip-flop 2 are connected to the scan-in inputs +I and −I of flip-flop 7; and the true and complementary outputs +L1 and −L1, respectively, of flip-flop 3 are connected to the scan-in inputs +I and −I of flip-flop 8. The complementary outputs −L2 of flip-flops 6 and 7 are connected to the scan-in inputs −I of flip-flops 2 and 3 respectively.

For systems operation, the system data signal +DATA is fed to the systems data input 9, which is connected to logic circuit 4, and the circuit is clocked by a clock signal +CLOCK that is applied to its clock input 10, which is connected to logic circuits 4 and 5. In accordance with the principles of the present invention, the circuit has set and reset inputs 11 and 12, respectively, for application of set and reset signals +SET and +RESET, respectively, which provide overriding set and reset asynchronous control of the circuit as hereinafter described. The true and complementary outputs +Q and −Q of the circuit are connected to the corresponding true and complementary outputs +L1 and −L1 of the output flip-flop 3.

For the testing operation, the test data signal −SCAN IN is applied to the test data input 13, which is connected to the scan-in input −I of flip-flop 1, and the non-overlapping clock signals +A CLOCK, +B CLOCK, +C CLOCK 1 and +CLOCK 2 are applied to the circuit control inputs 14-17, respectively. Input 14 is connected to the respective inputs +A of flip-flops 1-3; and the respective complementary inputs −A of flip-flops 1-3 are connected to input 14A, to which is applied clock signal −A CLOCK that is the complementary counterpart of +A clock. The +A CLOCK may be derived, for example, from signal −A CLOCK by an inverter, not shown. Input 16 is connected to the respective control inputs +C of flip-flops 1 and 2; and input 17 is connected to the control input +C of flip-flop 3. Input 15 is connected to the respective inputs +B of the L2 type flip-flops 6-8. The shift-out output −SCAN OUT is connected to the complementary output −L2 of flip-flop 8. It should be understood that the circuit of FIG. 1 along with other identical plural (P) circuits are connected in cascade as a shift register for testing purposes. As such, the cascade connected circuits are connected in a chain and the composite shift register has 3(P+1) stages, with the output −SCAN OUT of a preceeding three stage circuit being connected to the shift-in input 13 of the succeeding three stage circuit in the chain. In the embodiment of FIG. 1, it should be noted that each of the the L1 type flip-flops 1-3 has only one scan-in input −I and accordingly the flip-flops 1-3 and the circuit embodiment of FIG. 1 is referred to sometimes herein as a one scan-in input type. It should also be noted that the embodiment of FIG. 1 uses four non-overlapping clock signals, i.e. +A CLOCK, +B CLOCK, and +C CLOCKS 1 and 2.

The L1 and L2 type flip-flops 1-3 and 6-8 and supporting logic circuits 4 and 5 are preferably configured with a compatible logic circuit implementation. Thus, circuit 20 of FIG. 2, which is a preferred embodiment of an L1 type flip-flop of FIG. 1, is implemented with five AND-INVERT (AI) logic circuits (i.e. gates) 21-25 and one inverter circuit 26. Circuit 30 of FIG. 3, which is a preferred embodiment of an L2 type flip-flop of FIG. 1, is implemented with four AND-INVERT (AI) logic circuits 31-34 and is compatible with the logic circuit implementation of the circuit 20 of FIG. 2. Hence, in a preferred arrangement of the embodiment of the circuit apparatus of FIG. 1, each of the flip-flops 1-3 is configured with a circuit 20 of FIG. 2 and each of the flip-flops 6-8 is configured with a circuit 30 of FIG. 3.

Circuit 20' of FIG. 4 is another preferred embodiment of an L1 type flip-flop of FIG. 1 and is implemented with two AND-OR-INVERT (AOI) logic circuits 27-28 and one AND-INVERT (AI) circuit 29; and circuit 30' of FIG. 5 is another preferred embodiment of an L2 type flip-flop of FIG. 1 and is implemented with two AND-OR-INVERT (AOI) circuits 35-36 which are compatible with the logic circuit implementation of the circuit 20' of FIG. 4. Thus, in another preferred arrangement of the embodiment of the circuit apparatus of FIG. 1, each of the flip-flops 1-3 is configured with a circuit 20' of FIG. 4 and each of the flip-flops 6-8 is configured with a circuit 30' of FIG. 5.

For purposes of explanation, each of the AOI circuits shown herein are configured with a pair of two-input AND gates, the outputs of which are Ored by an OR-INVERT (OI) gate, such as the pair of AND gates 27a and 27b and OI gate 27c of the the AOI circuit 27 illustrated in greater detail in FIG. 4.

Preferably, in the embodiment of FIG. 1, logic circuit 4 is implemented with one OR-INVERT (OI) circuit 40, four AND-INVERT (AI) circuits 41-44, and six inverter circuits 45-50, the circuits 40-50 being compatible with any of the aforedescribed L1 and/or L2 types of flip-flop circuits of FIGS. 2-5. Inputs 11 and 12 are connected to the two inputs, respectively, of OI gate 40 and to the inputs of inverters 49 and 50, respectively. Input 10 is connected to the input of inverter 46. The three inputs of AI gate 41 are connected to the input 9, output of circuit 46 and output of gate 40, respectively. Input 9 is also connected to the input of inverter 45, and the three inputs of AI gate 42 are connected to the outputs of circuits 40, 45 and 46, respectively. The outputs of gates 41 and 42 are cross connected to one of the inputs of the two input AI gates 44 and 43, respectively. The other inputs of gates 43 and 44 are commonly connected to the output of OI gate 40. In addition, the outputs of gates 41 and 42 are connected to the inputs of inverters 47 and 48, respectively. The outputs of circuits 43 and 47 are connected to inputs +R and +S, respectively, of flip-flop 1; and the outputs of circuits 44 and 48 are connected to the inputs +R and +S, respectively of flip-flop 2. In addition, input 10 and the outputs of circuits 49 and 50 are connected to logic circuit 5.

Moreover, in the embodiment of FIG. 1, the logic circuit 5 is preferably implemented with four AND-INVERT circuits 51-54, the latter also being compatible with any of the aforedescribed L1 and/or L2 types of flip-flop circuits of FIGS. 2-5. Input 10 is connected to one of the inputs of each of the two input AI gates 51 and 52. The other inputs of gates 51 and 52 are connected to the +L1 outputs of flip-flops 1 and 2, respectively. The two inputs of AI gate 53 are connected to the outputs of circuits 49 and 51, respectively, and the output of gate 53 is connected to the input +S of flip-flop 3. The two inputs of AI gate 54 are connected to the outputs of circuits 50 and 52, respectively, and the output of gate 54 is connected to the input +R of flip-flop 3.

A detailed description of the overall operation of the circuit apparatus of FIG. 1 hereinafter follows the detail description of each of the flip-flop circuits of FIGS. 2-5 next presented herein under corresponding titles.

Circuit 20

Referring to FIG. 2, the inputs +S and +R of circuit 20 are Anded with the common input +C by the AI gate circuits 21 and 22, respectively. The outputs of circuits 21 and 22 are connected to respective inputs of AI circuits 23 and 24, respectively. The outputs of circuits 23 and 24 are cross-coupled to respective other inputs of circuits 24 and 23, respectively, in a basic flip-flop type arrangement. Circuit 24 also has another input −A. AI circuit 25 Ands the input +A with the complement of input −I via inverter (N) circuit 26. The outputs of circuits 24 and 25 are Dot-Anded and commonly connected to the output −L1. As such the output −L1 will be at a logical 1, i.e. a (+) level, only if both outputs of circuits 24 and 25 are at logical 1 levels.

During systems operation, the +A CLOCK and −A CLOCK are in their respective inactive levels, to wit: (−) and (+) levels, respectively. Accordingly, the (+) level of the −A CLOCK which is present at the input −A, cf. FIG. 1, of AI gate 24 of circuit 20 FIG. 2 and the (−) level of the +A clock which is present at the input +A of AI gate 25 enables and inhibits, respectively, the gates 24 and 25, respectively. As such, during systems operation, circuit 20 has the characteristics of a clocked SET/RESET flip-flop as indicated by the first four rows of the truth Table I below. It should be noted that with gate 25 inhibited, the output of gate 25 is forced to a (+) level irrespective of the level of the signal at input −I to inverter 26 and hence irrespective of the level of the input signal derived therefrom and fed to the other input of gate 25. Accordingly, the level at the Dot-Anded output −L1 of circuit 20 will be at a (+) level only when the signal level at the output of gate 24 is also at a (+) level. It should be noted that an X represents the Don't-Care state at the particular input with which the X is associated in Table I.

Thus, with input +C at a (−) level, gates 21 and 22 are inhibited, and the resultant (+) levels at their outputs enables gates 23 and 24, respectively, which become latched to their previous states +L1o and −L1o, respectively, as shown in the first row of Table I. For example, assume the case where the previous state +L1o of the true output +L1 of flip-flop 20, which is also the output of AI gate 23, is at a logical 1, i.e. a (+) level, and hence the complementary output −L1 is at a corresponding previous state −L1o=a (−) level. Under these conditions, AI gate 24 in response to the three (+) levels present at its three inputs causes the output of gate 24 to be at a (−) level. Consequently, the Dot-Anded output −L1 also remains at is previous state −L1o=a logical 0, i.e. a (−) level, which in turn when fed back to the input of gate 23 maintains the output +L1 at its previous state +L1o=a logical 1, thereby maintaining the flip-flop 20 latched to its previous states.

For the other case, the previous state +L1o of the true output +L1 of flip-flop 20 is at a logical 0, i.e. a (−) level, and hence the complementary output −L1 is at a corresponding previous state −L1o=a (+) level. Under these conditions, AI gate 23 in response to the two (+) levels present at its two inputs causes the output of gate 23 to be at a (−) level thereby maintaining the output +L1 at the (−) level. Moreover, the last-mentioned (−) level, which is fed back to one of the inputs of gate 24, causes the output of AI gate 24 to be at a (+) level. With the outputs of gates 24 and 25 both at (+) levels, the Dot-Anded output −L1 also remains at its previous state −L1o=a logical 1, i.e. a (+) level, which in turn when fed back to the input of gate 23 maintains the output +L1 at its previous state +Lo=a logical 0, thereby maintaining the flip-flop 20 latched to its previous states.

For flip-flop 20 to be set or reset during systems operation, the +C input is placed in its active level (+), thereby enabling the gates 21 and 22. Hence, the output +L1 of flip-flop 20 is set by a (+) level at input +S and is reset by a (+) level at input +R as indicated by the second and third rows, respectively, of Table I. Thus, for the set condition, i.e. a (+) level at input +S and hence a complementary level (−) at input +R as indicated by the second row of Table I, the outputs of gates 21 and 22 are at (−) and (+) levels, respectively. If the previous state +L1o of output +L1 is at a (+) level and hence the previous state −L1o of output −L1 is at a (−) level, the (−) level at the output of gate 21 Anded by AI gate 23 with the (−) level fed back from output −L1 causes the output of gate 23 and thus output +L1 to remain at a (+) level, and likewise the (+) level at the output of gate 22 Anded by AI gate 24 with the (+) level fed back from output +L1 and the (+) level at input −A causes the output of of AI gate 24 and hence the Dot-Anded output −L1 to remain at a (−) level, the output of gate 25 being at a (+) level as previously explained. With +S and +R at at (+) and (−) levels, respectively, if the previous state +L1o of output +L1 is at a (−) level and hence the previous state −L1o of output −L1 is at a (+) level, the (−) level at the output of gate 21 Anded by AI gate 23 with the (+) level fed back from output −L1 causes the output of gate 23 and thus output +L1 to be set at a (+) level, and likewise the (+) level at the output of gate 22 Anded by AI gate 24 with the now (+) level fed back from output +L1 and the (+) level at input −A causes the output of of AI gate 24 and hence the Dot-Anded output −L1 to go to a (−) level, the output of gate 25 being at a (+) level as previously explained.

For the reset condition of circuit 20, i.e. a (+) level at input +R and hence a complementary level (−) at input +S as indicated by the third row of Table I, the outputs of gates 21 and 22 are at (+) and (−) levels, respectively. In the case where the previous state +L1o of output +L1 is at a (+) level and hence the previous state −L1o of output −L1 is at a (−) level, the (−) level at the output of gate 22 Anded by AI gate 24 with the (+) level fed back from output +L1 and the (+) level at input −A causes the output of gate 24 and thus the Dot-Anded output −L1 to change to a (+) level, the output of AI gate 25 being at a (+) level as previously explained. The now (+) level at the output of gate 24 is in turn Anded with the (+) level at the output of gate 21 by AI gate 23 causing the output of gate 23 and hence +L1 to change to a (−) level thereby latching the outputs of +L1 and −L1 to (−) and (+) levels, respectively, and circuit 20 is thus reset. On the other hand, with the inputs +S and +R at (−) and (+) levels, respectively, and, consequently, the outputs of gates 21 and 22 are at (+) and (−) levels, i.e. under reset conditions, if the previous state +L1o of output +L1 is at a (−) level and hence the previous state −L1o of output −L1 is at a (+) level, the (−) level at the output of gate 22 Anded by AI gate 24 with the (−) level fed back from output +L1 and the (+) level at input −A causes the output of gate 24 and thus the Dot-Anded output −L1 to remain at a (+) level, the output of AI gate 25 being at a (+) level as previously explained. The (+) level at the output of gate 24 is in turn Anded with the (+) level at the output of gate 21 by AI gate 23 causing the output of gate 23 and hence +L1 to remain at a (−) level thereby latching the outputs +L1 and −L1 to (−) and (+) levels, respectively, and circuit 20 is thus reset.

The fourth row of Table I represents a non-stable (NS) condition of circuit 20, and is avoided, i.e. not used, by not making the levels of the input signals to +S and +R both (+) levels at the same time.

For testing operation, with input +C inactive, i.e. at a (−) level, and inputs +A and −A at their active levels (+) and (−), respectively, the (−) level at input +C inhibits gates 21 and 22, thus forcing their outputs to a (+) level. The (−) level at input −A places the output of gate 24 to a (+) level thus conditioning the Dot-And output −L1 to be responsive to the output level of AI gate 25. Consequently, the level at output −L1 follows the level at the input −I and the level at +L1 follows in a complementary manner as shown by the fifth and sixth rows of Table I.

More specifically, a 0 or (−) level at input −I results in a (+) level at the output of inverter 26 which when Anded by AI gate 25 with the (+) level at input +A causes the output −L1 to go to or remain at a (−) level depending on its previous state. Thus, for the case where the previous states +L1o and −L1o of outputs +L1 and −L1, respectively, are at (+) and (−) levels, respectively, and the input −I is placed in a (−) level, the inverted (+) level Anded by gate 25 with the (+) level at input +A causes the output of gate 25 and hence the Dot-And output −L1 to remain at a (−) level. This last mentioned level (−) when Anded by AI gate 23 with the (+) level at its other input causes the output of gate 23 and hence the output +L1 to remain at its (+) level. It should be noted that, even though the output of gate 24 is at (+) level as a result of the (−) level of input −A, it is the (−) level at the output of gate 25 which controls the level at the Dot-Anded output −L1.

In the other case, where the previous states +L1o and −L1o of outputs +L1 and −L1, respectively, are at (−) and (+) levels, respectively, and the input −I is in a (−) level, the inverted (+) level Anded by gate 25 with the (+) level at input +A causes the output of gate 25 and hence the Dot-And output −L1 to change to a (−) level. This last mentioned level (−) when Anded by AI gate 23 with the (+) level at its other input causes the output of gate 23 and hence the output +L1 to change to a (+) level. It should be again noted that, even though the output of gate 24 is at (+) level as a result of the (−) level of input −A, it is the (−) level at the output of gate 25 which controls the level at the Dot-Anded output −L1. Thus, for either of the last two described cases of the previous states of the outputs +L1 and −L1, when input−I is placed in a (−) level, the level of output −L1 will remain or be placed at the same (−) level as indicated by the fifth row of Table I.

Similarly, a 1 or (+) level at input −I results in a (−) level at the output of inverter 26 which when Anded by AI gate 25 with the (+) level at input +A causes the output −L1 to go to or remain at a (+) level depending on its previous state. Thus, for the case where the previous states +L1o and −L1o of outputs +L1 and −L1, respectively, are at (+) and (−) levels, respectively, and the input −I is placed in a (+) level, the inverted (−) level Anded by gate 25 with the (+) level at input +A causes the output of gate 25 and hence the Dot-And output −L1 to change to a (+) level. This last mentioned (+) level when Anded by AI gate 23 with the (+) level at its other input causes the output of gate 23 and hence the output +L1 to change to its (−) level. It should be noted that the output of gate 24 is at (+) level as a result of the (−) level at input −A and/or at the output of gate 23 and when Dot-Anded with the (+) level at the output of gate 25 results in a (+) level at the Dot-Anded output −L1.

In the other case, where the previous states +L1o and −L1o of outputs +L1 and −L1, respectively, are at (−) and (+) levels, respectively, and the input −I is placed in a (+) level, the inverted (−) level Anded by gate 25 with the (+) level at input +A causes the output of gate 25 and hence the Dot-And output −L1 to remain at a (+) level. This last mentioned (+) level when Anded by AI gate 23 with the (+) level at its other input causes the output of gate 23 and hence the output +L1 to remain at a (−) level. It should be again noted that the output of gate 24 is at a (+) level as a result of the (−) level at input −A and/or of the output of gate 23. The (+) levels at the outputs of gates 24 and 25 result in a (+) level at the Dot-Anded output −L1. Thus, for either of the last two described cases of the previous states of the outputs +L1 and −L1, when input −I is placed in a (+) level, the level of output −L1 will remain or be placed at the same (+) level as indicated by the sixth row of Table I.

The seventh row of Table I is a special case which in accordance with the principles of the present invention allows the outputs of +L1 and −L1 of flip-flop 20 to remain in their previous states +L1o and −L1o, respectively, during systems operation when the −A CLOCk and +A CLOCK are in their inactive levels at the inputs −A and +A, respectively, the +C input is at a (+) level, and inputs +S and +R are at (−) levels. Thus, with inputs +S and +R at (−) levels and input +C at a (+) level, the outputs of AI gates 21 and 22 are both at (+) levels. For the case where the previous states +L1o and −L1o are at (+) and (−) levels, respectively, the (−) level at output −L1 inputted to gate 23 with the (+) level at its other input provides a (+) level at the output of gate 23 and thereby maintains the (+) level at the output +L1. This last mentioned (+) level when fed back to the input of gate 24 and inputted with the other (+) levels at the two other inputs of gate 24 provides a (−) level at the output of gate 24. As previously explained the (−) level of +A CLOCK at the input of gate 25 provides a (+) level at its output which when Dot-Anded with the (−) level at the output of gate 24 maintains the (−) level at the output −L1. For the other case where the previous states +L1o and −L1o are at (−) and (+) levels, the fed back (−) level to gate 24 provides a (+) level at its output which is And-dotted with the (+) level at the output of gate 25 and fed back to the input of gate 23 where it is inputted with the other (+) level resulting in the (−) level at the output of gate 23 and hence a (−) level at the output +L1.

TABLE I

| −A | +A | −I | +C | +S | +R | −L1 | +L1 |
| --- | --- | --- | --- | --- | --- | --- | --- |
| + | − | X | − | X | X | −L1o | +L1o |
| + | − | X | + | + | − | − | + |
| + | − | X | + | − | + | + | − |
| + | − | X | + | + | + | NS | NS |
| − | + | − | − | X | X | − | + |
| − | + | + | − | X | X | + | − |
| + | − | X | + | − | − | −L1o | +L1o |

Circuit 30

Referring to FIG. 3, circuit 30 is configured as a clocked SET/RESET flip-flop. The data inputs +I and −I of circuit 30 are Anded with the common clock input +B by the AI circuits 31 and 32, respectively. The outputs of circuits 31 and 32 are connected to an input of AI circuits 33 and 34, respectively. The outputs +L2 and −L2 of circuit 30 are connected to the outputs of circuits 33 and 34, respectively, which are cross-coupled to respective other inputs of one another in a basic flip-flop type arrangement.

In operation, with the +B CLOCK, FIG. 1, in its inactive level, i.e. a (−) level, gates 31 and 32, FIG. 3, which are fed thereby at input +B, are inhibited, and the outputs +L2 and −L2 of flip-flop 30 will be in their previous complementary states +L2o and −L2o, respectively. When the +B Clock is in its active level, i.e. a (+) level, a (+) level at input +I sets the true output +L2 at a (+) level, whereas a (−) level resets the true output +L2 at a (−) level, it being understood that the levels at inputs +I and −I are complementary with respect to each other and similarly the levels at outputs +L2 and −L2 are complementary with respect to each other.

Thus, with input +B at a (+) level, as the result of the (+) and (−) levels at inputs at +I and −I, respectively, the outputs of gates 31 and 32 are at (−) and (+) levels, respectively. In the case where the previous states +L2o and −L2o are at (+) and (−) levels, respectively, AI gate 33 in response to the (−) levels at its two inputs maintains the (+) level at the output +L2, and AI gate 34 in response to the (+) levels at its two inputs maintains the (−) level at output −L2. In the case where the previous states +L2o and −L2o are at (−) and (+) levels, respectively, the (−) and (+) levels at the inputs of gate 33 produce a (+) level at its output changing the output +L2 to a (+) level. The last-mentioned (+) level when Anded by gate 34 with the (+) level output of gate 32 changes the output of gate 34 and thus output −L2 to a (−) level. Thus, for the last-two described cases, flip-flop 30 is set in response to the (+) level at input +I. For reset conditions, input +B is again at an (+) level, and as the result of the (−) and (+) levels at inputs at +I and −I, respectively, the outputs of gates 31 and 32 are also at (+) and (−) levels, respectively. For the case where the previous states +L2o and −L2o are at (+) and (−) levels, respectively, AI gate 34 in response to the (+) and (−) levels at its inputs changes the (−) level at the output −L2 to a (+) level, which in turn when Anded by AI gate 33 with the other (+) level at its input changes the output +L2 to a (−) level. In the case where the previous states +L2o and −L2o are at (−) and (+) levels, respectively, the (−) levels at the inputs of gate 34 produce a (+) level at its output thereby keeping the output −L2 at a (+) level. The last-mentioned (+) level when Anded by gate 33 with the (+) level output of gate 31 maintains the output of gate 33 and thus output +L2 at a (−) level. Thus, in the last-two described cases, flip-flop 30 is reset in response to the (+) level at input −I. The foregoing is summarized in the following truth Table II.

TABLE II

| +B | −I | +I | −L2 | +L2 |
|---|---|---|---|---|
| − | X | X | −L2o | +L2o |
| + | − | + | − | + |
| + | + | − | + | − |

Circuit 20'

Referring to FIG. 4, the flip-flop circuit 20' thereof provides the same function as its counterpart circuit 20 of FIG. 2 and its truth table is identical with truth Table I. Hence, for sake of explanation, the inputs and outputs of circuits 20 and 20' are designated with identical reference characters.

Accordingly, the inputs +S and +R of circuit 20° are Anded with the common input +C by the AOI circuit 27 and AI circuit 29, respectively. The outputs of circuits 27 and 29 are connected to the outputs −L1 and +L1, respectively, of circuit 20'. In addition, the output of AOI circuit 27 is processed with the inputs +A, −A, and −I of circuit 20' by AOI circuit 28. Output +L1 is also connected to the output of AOI circuit 28 as well as to another input of AOI circuit 27. The outputs of circuits 28 and 29 are Dot-Anded at output +L1.

More particularly, inputs +S and +C are connected to respective ones of the two inputs of AND gate 27a of AOI circuit 27, the output +L1 is commonly connected to the two inputs of AND gate 27b, and the outputs of gates 27a and 27b are Ored by OI gate 27c. The two inputs of the AND gate, not shown, of AOI gate 28 corresponding to the gate 27a of gate 27, are connected to inputs +A and −I, respectively, and the two inputs of the other AND gate, not shown, of AOI gate 28 are connected to the input −A and output of AOI circuit 27.

During systems operation, +A CLOCK and −A CLOCK are in their respective inactive levels, to wit: (−) and (+) levels, respectively, as aforementioned. The (+) level of the −A CLOCK thus present at the input −A, cf. FIG. 1, enables the particular AND gate, not shown, of circuit 28 to which input −A is connected; whereas, the (−) level of +A clock at input +A inhibits the other AND gate, not shown, of circuit 28. As such, during systems operation, circuit 20' has the characteristics of a clocked SET/RESET flip-flop as indicated by the first four rows of the truth Table I.

Thus, with input +C at a (−) level, cf. first row of Table I, AND gate 27a and AI gate 29 are inhibited, and their respective outputs are at (−) and (+) levels, respectively. As a result, with a (+) level at the output of gate 29, the Dot-And output +L1 follows the level of the output of gate 28. If the previous states +L1o and −L1o of the outputs +L1 and −L1, respectively, are (−) and (+) levels, respectively, then the inputs to AND 27b and its output are at (−) levels. In response to the (−) levels at the inputs of OI gate 27c, the output of AOI gate 27 is at a (+) level which corresponds to the (+) level of the previous state −L1o of output −L1. Moreover, the (+) level at the output of circuit 27, when Anded with the (+) level at input−A by the AND gate, not shown, of AOI circuit 28 to which they are applied causes a (−) level at the output of AOI circuit 28 which corresponds to the (−) level of the previous state +L1o of output +L1.

As is apparent to those skilled in the art, it can be readily shown that for the other case in which the previous states +L1o and −L1o are at (+) and (−) levels, respectively, and the input +C is at a (−) level, the outputs +L1 and −L1 of flip-flop 20 will be correspondingly at (+) and (−) levels, respectively, as indicated by the first row of Table I.

For flip-flop 20' to be set or reset during systems operation, the +C input is placed in its active level (+) as aforementioned. As a result, gates 27a and 29 are enabled. Hence, the output +L1 of flip-flop 20 is set by a (+) level at input +S and is reset by a (+) level at input +R as indicated by the second and third rows, respectively, of Table I. Thus, for sake of explanation, it will be assumed that flip-flop 20' is to be set. AND gate 27a in response to the (+) levels at inputs +S and +C provides at its output a (+) level, which is inverted by the OI gate 27c thus maintaining or changing, as the case may be, the previous state −L1o at the output −L1 to a (−) level. It should be noted that the OI gate 27c provides the (−) level at its output irrespective of the level of the previous state +L1o of the output +L1 applied to the inputs of the other AND gate 27b. Moreover, the (−) level at the output of AOI gate 27 when Anded with the (+) level at the input −A by the particular AND gate, not shown, of AOI gate 28 to which they are fed causes a (−) level at the output of the particular AND gate. Likewise, the output of the other AND gate, not shown, of AOI circuit 28 is at a (−) level due to the presence of the (−) level at input +A. Consequently, the output of AOI circuit 28 is at a (+) level, as is the output of AI gate 29 due to the presence of the level (−) at the complementary input +R. The (+) levels present at the last two mentioned outputs are Dot-Anded at output at output +L1 thereby maintaining or changing, as the case might be, the previous state +L1o of output +L1 to a (+) level, and thereby setting the flip-flop 20' as indicated by the second row of Table I.

Similarly, as is apparent to those skilled in the art, it can be readily shown from the foregoing description that the flip-flop 20' is reset when the input +R is at a (+) level as indicated by the third row of Table I. As before, fourth row of Table I, which represents the unstable condition of flip-flop 20', is avoided by not making the levels of the input signals at inputs +S and +R both (+) at the same time.

As indicated by the fifth and sixth rows of Table I, for testing operation, with input +C is inactive, i.e. at a (−) level, and inputs +A and −A are at their active levels (+) and (−), respectively, gates 27a and 29 are inhibited by the (−) level at input +C. The Dot-And output +L1 thus follows the level at the output of AOI gate 28 as the output of gate 29 is at a (+) level. Moreover, the Dot-And output +L1 will be at (+) and (−) levels in response to a (−) and (+) levels, respectively, at input −I which are Anded with the (+) level at input +A fed to the particular AND gate, not shown, of circuit 28, the other AND gate, not shown, of circuit 28 being inhibited by the (−) level at input −A. Because of the feedback connection of the output +L1 to the inputs of AND gate 27b, the level at the output of OI gate 27c and hence the levels at the outputs of AOI circuit 27 and the output −L1 will be complementary to the level at the output +L1.

As previously explained, the seventh row of Table I is a special case which in accordance with the principles of the present invention allows the outputs +L1 and −L1 of flip-flop 20' to remain in their previous states +L1o and −L1o, respectively, during systems operation when the −A CLOCK and +A CLOCK are in their inactive levels at the inputs −A and +A, respectively, the +C input is at a (+) level, and inputs +S and +R are at (−) levels. Thus, with inputs +S and +R at (−) levels and input +C at a (+) level, the output of AI gate 29 is at a (+) level in response to the (+) and (−) levels at inputs +C and +R, respectively. Accordingly, the Dot-Anded output +L1 follows the level of the output of AOI gate 28. Moreover, AND gate 27a is inhibited in response to the (−) and (+) levels at inputs +S and +C, respectively, and thereby provides a (−) level at its output. The (−) level at input +A inhibits the AND gate, not shown, of AOI circuit 28 which corresponds to the AND gate 27a of circuit 27; whereas, the (+) level of input −A enables the other AND gate, not shown, of circuit 28.

For the case where the previous states +L1o and −L1o are at (−) and (+) levels, the (−) level at +L1, which feeds the two inputs of AND gate 27b, provides a (−) level at the output of gate 27b. The (−) levels at the inputs of OI gate 27c cause a (+) level at the output of gate 27 and output −L1 which is its given previous state −L1o for the case being described. In response to this last mentioned (+) level and the (+) level of input −A, the AND gate, not shown, of circuit 28 corresponding to the AND gate 27b of circuit 27 provides a (+) level at its output which is Ored by the OI gate, not shown, of circuit 28 with the (−) level at the output of the other AND gate, not shown, of circuit 28, and resulting in a (−) level at the output of circuit 28 and thus the Dot-Anded output +L1 is in its given previous state +L1o.

For the case where the previous states +L1o and −L1o are at (+) and (−) levels, the (+) level at +L1, which feeds the two inputs of AND gate 27b, provides a (+) level at the output of gate 27b. The last mentioned (+) level and the (−) level at the output of AND gate 27a provide a (−) level at the output of circuit 27 and thus the output −L1 is in its given previous state −L1o. The last mentioned (−) level at the output of circuit 27 and the (+) level of input −A provide a (−) level at the output of AND gate, not shown, of circuit 28 to which they are applied. As a result, the outputs of the two AND gates, not shown, of circuit 28 are at (−) levels resulting in the output of circuit 28 being at a (+) level and hence the output +L1 being in its given previous state +L1o.

Circuit 30'

Referring to FIG. 5, the flip-flop circuit 30' is configured as a clocked SET/RESET flip-flop and performs the same function as its counterpart circuit 30 of FIG. 3 and its truth table is identical with truth Table II. Hence, for sake of explanation, the inputs and outputs of circuits 30 and 30' are designated with identical reference characters.

In circuit 30', inputs +I and −I of circuit 30' are Anded with the common input +B by the respective AND gates, not shown, of AOI circuits 35 and 36, respectively, which correspond to the AND gate 27a of AOI circuit 27 of FIG. 4. The outputs of circuits 35 and 36 are connected to the outputs −L2 and +L2, respectively, of circuit 30', as well as being cross-coupled to the respective inputs of the other AND gates, not shown, of circuits 35 and 36 that correspond to the other AND gate 27b of circuit 27.

In operation, with the +B CLOCK, FIG. 1, in its inactive level, i.e. a (−) level, at input +B, the respective AND gates, not shown, of AOI circuits 35 and 36 that correspond to the AND gate 27a of AOI circuit 27 are inhibited. As is apparent to those skilled in the art, it can be readily shown that under these circumstances, the outputs +L2 and −L2 are maintained in their previous states +L2o and −L2o, respectively, as indicated by the first row of Table II.

Likewise, it can readily be shown that with input +B at a (+) level and (+) and (−) levels at inputs at +I and −I, respectively, the (+) levels at the inputs +B and +I are ANDed by the AND gate, not shown, of circuit 35 to which they are applied resulting in a (+) level at the output of the last mentioned AND gate and a (−) level at the output of AOI circuit 35 and irrespective of the common input level applied to the inputs of the other AND gate, not shown, of circuit 35. The (−) level at output of circuit 35 is fed to the commonly connected inputs of the AND gate, not shown, of circuit 36 resulting in a (−) level in the output of the last mentioned AND gate. In response to the (+) level at input +B and (−) level at input −I, the output of the other AND gate, not shown, of circuit 36 is thus also at (−) level, and as a result, the output of the OI circuit, not shown, of circuit 36 is at a (+) level. Accordingly, the outputs +L2 and −L2 of flip-flop 30' are at (+) and (−) levels, respectively, as indicated by the second row of Table II.

Likewise, it can readily be shown that with input +B at a (+) level and (−) and (+) levels at inputs at +I and −I, respectively, the (−) level at the input +I inhibits the AND gate, not shown, of circuit 35 to which it is applied resulting in a (−) level at the output of the last mentioned AND gate. In circuit 36, however, the (+) levels at the inputs +B and −I fed to the particular AND gate, not shown, thereof produce a (+) level at the output of the last-mentioned AND gate of circuit 36, which when inverted by the OI gate, not shown, of circuit 36 results in a (−) level at the output circuit 36 and hence at output +L2. This (−) level is applied to the commonly connected two inputs of the other AND gate, not shown, of circuit 35 resulting in a (−) level at the output of the last mentioned AND gate. The OI circuit, not shown, of circuit 35 Ors and inverts the (−) levels at the outputs of the two AND gates, not shown, of circuit 35 thereby resulting in a (+) level at output −L2 and maintaining the (−) level at output +L2 as indicated by the third row of Table II.

Circuit-FIG. 1

The operation of the circuit apparatus of FIG. 1 has two preferred operational modes referred to herein as systems operations and testing operations as previously mentioned. The circuit acts as a D-type edge triggered latch in the systems operational mode and as a three-stage shift register in the testing operational mode as previously mentioned.

For sake of clarity, a convention is used herein in which a polarity sign is prefixed to the signal legends, to indicate the active level of the signal with which it is associated. Thus, the active level of the signals +DATA, +CLOCK, +SET, +RESET, +A CLOCK, +B CLOCK, +C CLOCK 1 and +C CLOCK 2 is an UP or (+) level, and their inactive level is a DOWN or (−) level. For the signals −A CLOCK, −SCAN IN and −SCAN OUT, the active level is a DOWN or (−) level and the inactive level is a UP or (+) level. Moreover, for sake of explanation, by way of example a binary 1 is represented by a (+) level and a binary 0 by a (−) level. For sake of explanation, a truth Table III for the systems operational mode of the circuit is presented below.

In the systems operational mode of the circuit, the signal +A CLOCK, −A CLOCK, and +B CLOCK are in their inactive levels and +C CLOCKS 1 and 2 are in their active levels. Moreover, when system data is to be entered into the circuit by signal +DATA, signals +SET and +RESET are at (−) levels. The circuit is triggered by positive transition +tr of a pulse of signal +CLOCK, i.e. a transition from its inactive level (−) to its (+) level. Accordingly, +CLOCK is in its inactive level (−) just prior to a positive transition. As a result, the outputs of AI gates 51 and 52, which are inputted by +CLOCK, of circuit 5 are at (+) levels irrespective of the levels at the outputs +L1 of flip-flops 1 and 2, which are also inputted to gates 51 and 52, respectively. Also, the (−) levels of +SET and +RESET are inverted by inverters 49 and 50, respectively, of circuit 4. The AI gate 53, which Ands the outputs of gates 49 and 51, and the AI gate 54, which Ands the outputs of gates 50 and 52, will have (−) levels at their outputs in response to the two (+) levels at each of their respective two inputs. These last mentioned two (−) levels are applied to the +S and +R inputs of flip-flop 3. However, referring to the seventh row of Table I, it should be noted that with the (+) level of −A CLOCK at input −A of flip-flop 3, and the (−) and (+) levels of +A CLOCK and +C CLOCK 2 at the respective inputs +A and +C, respectively, of flip-flop 3, its outputs +L1 and −L1 are at at their respective previous states +L1o and −L1o, respectively. Accordingly, the outputs +Q and −Q of the circuit will be at output states +Qo and −Qo, respectively, and thus have the same output levels as the states +L1o and −L1o of flip-flop 3, cf. the first row of Table III.

Sometime prior to the positive transition of the triggering clock pulse of signal +CLOCK, the information next to be stored in the D-type edge-triggered latch circuit is applied by placing or maintaining the signal +DATA at an appropriate binary bit level, i.e. a 1 or a 0. For sake of explanation, the first case which is next described is that where a binary 1 is to be stored in the circuit, and hence +DATA is at a (+) level, cf. second row of Table III. In response to the concurrent (−) levels of +SET and +RESET at its inputs, OI gate 40 provides a (+) level at its output which enables the respective inputs of gates 41–44 to which it is applied. Also, those inputs of gates 41 and 42, which are connected to the output of inverter 46, are enabled by a (+) level as a result of the inversion thereby of the (−) level of +CLOCK. Accordingly, the (+) level of +DATA enables the remaining input of gate 41; whereas, as a result of its inversion to a (−) level by inverter 45, the remaining input of gate 42 is inhibited. Thus, the outputs of AI gates 41 and 42 are at (−) and (+) levels, respectively, and the outputs of inverters 47 and 48 are at (+) and (−) levels, respectively. The (−) level at the output of gate 41 inhibits gate 44 causing the output of AI gate 44 to be at a (+) level. On the other hand, the (+) level at the output of gate 42 in conjunction with the other (+) level at the output of circuit 40, enables the gate 43 thereby causing a (−) level at the output of gate 43.

Accordingly, just prior to the positive transition of +CLOCK, the flip-flops 1 and 2 have the following input conditions, to wit: the common input conditions of their respective inputs −A and +C being at (+) levels and their respective inputs +A being at (−) levels, and the complementary input conditions of inputs +S and +R of flip-flop 1 being at (+) and (−) levels, respectively, and the +S and +R inputs of flip-flop 2 being at (−) and (+) levels, respectively. For these input conditions, the outputs +L1 and −L1 of flip-flop 1 are at (+) and (−) levels, respectively, and the outputs +L1 and −L1 of flip-flop 2 are at (−) and (+) levels, respectively, cf. second and third rows, respectively, of Table I. Moreover, because gates 51 and 52 are inhibited by the (−) level of +CLOCK, the input conditions to flip-flop 3 remain unchanged and its outputs +L1 and −L1 remain in their previous states +L1o and −L1o, respectively, for the reasons previously explained.

Upon the positive transition of the +CLOCK pulse, the respective inputs of gates 51 and 52 fed thereby are enabled. For the given +DATA bit example being described, the (+) level at the output +L1 of flip-flop 1 and the (−) level at the output +L1 of flip-flop 2 in conjunction with the (+) level of the +CLOCK transition, places the outputs of gates 51 and 52 at (−) and (+) levels, respectively, thereby inhibiting gate 53 and enabling gate 54. The outputs of gates 53 and 54 are thus placed at (+) and (−) levels, respectively, whereupon flip-flop 3 now has the input conditions of the second row of Table I and the outputs +L1 and −L1 of flip-flop 3 and hence the outputs +Q and −Q of the circuit are latched to (+) and (−) levels, respectively.

It should be noted that with +CLOCK at its (+) level, the resultant (−) level at the output of inverter 46 inhibits the gates 41 and 42 placing the latters' respective outputs to (+) levels. Inverters 47 and 48 invert these last mentioned (+) levels to (−) levels which places (−) levels at inputs +S of flip-flops 1 and 2, which also have (−) levels at their respective inputs +R. Accordingly, flip-flops 1 and 2 become latched to their previous states +L1o and −L1o, cf. the seventh row of Table I. Thus, the outputs +L1 and −L1 of the flip-flops 1-3 and thus outputs +Q and −Q of the circuit are not effected by any change in the level of the +DATA signal while +CLOCK is in its (+) level after its positive transition. Moreover, the outputs +L1 and −L1 of flip-flops 1 and 2 are only changed by the +DATA signal when +Clock is in its (−) level, thereby leaving the outputs +L1 and −L1 of flip-flop 3 in their previous states until the next positive transition of the +CLOCK.

For the case where a 0 bit is to be stored in the D-type edge-triggered circuit, similar to the last described case of the 1 bit, sometime prior to the positive transition of the triggering clock pulse of signal +CLOCK, the information next to be stored in the circuit is applied by placing or maintaining the signal +DATA at a (−) level, i.e. a binary 0, cf. third row of Table III. Likewise, as in the case of the 1 bit, in response to the concurrent (−) levels of +SET and +RESET at its inputs, OI gate 40 provides a (+) level at its output which enables the respective inputs of gates 41-44 to which it is applied. Also, those inputs of gates 41 and 42, which are connected to the output of inverter 46, are enabled by a (+) level as a result of the inversion thereby of the (−) level of +CLOCK. However, the (−) level of +DATA inhibits the remaining input of gate 41; whereas, as a result of its inversion to a (+) level by inverter 45, the remaining input of gate 42 is enabled. Thus, the outputs of AI gates 41 and 42 are at (+) and (−) levels, respectively, and the outputs of inverters 47 and 48 are at (−) and (+) levels, respectively. The (+) level at the output of gate 41 in conjunction with the other (+) level at the output of circuit 40 enables gate 44 causing the output of AI gate 44 to be at a (−) level. On the other hand, the (−) level at the output of gate 42 inhibits gate 43 thereby causing a (+) level at the output of gate 43.

Accordingly, just prior to the positive transition of +CLOCK, the flip-flops 1 and 2 have the following input conditions, to wit: the common input conditions of their respective inputs −A and +C being at (+) levels and their respective inputs +A being at (−) levels, and the complementary input conditions of inputs +S and +R of flip-flop 1 being at (−) and (+) levels, respectively, and the +S and +R inputs of flip-flop 2 being at (+) and (−) levels, respectively. For these input conditions, the outputs +L1 and −L1 of flip-flop 1 are at (−) and (+) levels, respectively, and the outputs +L1 and −L1 of flip-flop 2 are at (+) and (−) levels, respectively, cf. third and second rows, respectively, of Table I. Moreover, because gates 51 and 52 are inhibited by the (−) level of +CLOCK, the input conditions to flip-flop 3 remain unchanged and its outputs +L1 and −L1 remain in their previous states +L1o and −L1o, respectively, for the reasons previously explained.

Upon the positive transition of the +CLOCK pulse, the respective inputs of gates 51 and 52 fed thereby are enabled. For the given +DATA bit example being described, the (−) level at the output +L1 of flip-flop 1 and the (+) level at the output of flip-flop 2 in conjunction with the (+) level of the +CLOCK transition, places the outputs of gates 51 and 52 at (+) and (−) levels, respectively, thereby enabling gate 53 and inhibiting gate 54. The outputs of gates 53 and 54 are thus placed at (−) and (+) levels, respectively, whereupon flip-flop 3 now has the input conditions of the third row of Table I and the outputs +L1 and −L1 of flip-flop 3 and hence the outputs +Q and −Q of the circuit are latched to (−) and (+) levels, respectively.

It should be noted that with +CLOCK at its (+) level, the resultant (−) level at the output of inverter 46 inhibits the gates 41 and 42 placing the latters' respective outputs to (+) levels. Inverters 47 and 48 invert these last mentioned (+) levels to (−) levels which places (−) levels at inputs +S of flip-flops 1 and 2, which also have (−) levels at their respective inputs +R. Accordingly, flip-flops 1 and 2 become latched to their previous states +L1o and −L1o, cf. the seventh row of Table I. Thus, the outputs +L1 and −L1 of the flip-flops 1-3 and thus outputs +Q and −Q of the circuit are not effected by any change in the level of the +DATA signal while +CLOCK is in its (+) level after its positive transition. Moreover, the outputs +L1 and −L1 of flip-flops 1 and 2 are only changed by the +DATA signal when +Clock is in its (−) level, thereby leaving the outputs +L1 and −L1 of flip-flop 3 in their previous states until the next positive transition of the +CLOCK.

In accordance with the principles of the present invention, the D-type edge-triggered latch circuit in the systems operational mode has overriding SET/RESET asynchronous control capability. More particularly, the coaction of circuits 1-5 is such that, irrespective of the levels of the signals +DATA and/or +CLOCK, for the input conditions of a (+) and (−) levels of the signals +SET and +RESET, respectively, the output +Q of the circuit is set to a (+) level, and for the input conditions of a (−) and (+) levels of the signals +SET and +RESET, respectively, the output +Q of the circuit is reset to a (−) level, the level at output −Q being complementary with respect to the level at output +Q.

Thus, if the circuit is to be asynchronously controlled by the signal +SET, signal +SET is placed in its (+) level and signal +RESET in its (−) level, cf. fourth row of Table III. As a result, the outputs of inverters 49 and 50 are placed at (−) and (+) levels, respectively. The (−) level of inverter 49 inhibits AI gate 53 placing a (+) level at the input +S of flip-flop 3. The (+) level of inverter 50 enables the input of gate 54 to which it is applied. However, it should be noted that the (+) level of signal +SET causes a (−) level at the output of OI gate 40 which in turn inhibits gate 42 and thus places a (+) level at its output which is inverted by inverter 48 to a (−) level and applied to the input +S of flip-flop 2. The (−) level at the output of OI gate 40 also inhibits gate 44 causing a (+) level at input +R of flip-flop 2. Under these conditions, the output +L1 of flip-flop 2 is at a (−) level as indicated by the third row of Table I. The last mentioned (−) level in turn inhibits AI gate 52 thereby providing a (+) level at the other input of AI gate 54, which in turn provides a (−) level at the input +R of flip-flop 3. Thus, with inputs +S and +R of flip-flop 3 at (+) and (−) levels, respectively, the outputs +L1 and −L1 of flip-flop 3 are at (+) and (−) levels, respectively, and the circuit outputs +Q and −Q have been set to (+) and (−) levels, respectively, thereby setting the circuit asynchronously with the overriding SET control.

If the circuit is to be asynchronously controlled by the signal +RESET, signal +SET is placed in its (−) level and signal +RESET in its (+) level, cf. fifth row of Table III. As a result, the outputs of inverters 49 and 50 are placed at (+) and (−) levels, respectively. The (−) level of inverter 50 inhibits AI gate 54 placing a (+) level at the input +R of flip-flop 3. The (+) level of inverter 49 enables the input of gate 53 to which it is applied. However, it should be noted that the (+) level of signal +RESET causes a (−) level at the output of OI gate 40 which in turn inhibits gate 41 and thus places a (+) level at its output which is inverted by inverter 47 to a (−) level and applied to the input +S of flip-flop 1. The (−) level at the output of OI gate 40 also inhibits gate 43 causing a (+) level at input +R of flip-flop 1. Under these conditions, the output +L1 of flip-flop 1 is at a (−) level as indicated by the third row of Table I. The last mentioned (−) level in turn inhibits AI gate 51 thereby providing a (+) level at the other input of AI gate 53, which in turn provides a (−) level at the input +S of flip-flop 3. Thus, with inputs +S and +R of flip-flop 3 at (−) and (+) levels, respectively, the outputs +L1 and −L1 of flip-flop 3 are at (−) and (+) levels, respectively, and the circuit outputs +Q and −Q have been reset to (−) and (+) levels, respectively, thereby resetting the circuit asynchronously with the overriding RESET control.

The truth table for the aforedescribed systems operational mode of the circuit is indicated in the following Table III.

TABLE III

| +SET | +RESET | +CLOCK | +DATA | +Q | −Q |
|---|---|---|---|---|---|
| − | − | − | X | +Qo | −Qo |
| − | − | +tr | + | + | − |
| − | − | +tr | − | − | + |
| + | − | X | X | + | − |
| − | + | X | X | − | + |
| + | + | X | X | NS | NS |

The last row of Table III represents a nonstable condition of the circuit which is not used and is avoided by not placing the +SET and +RESET signals in concurrent (+) levels.

In the testing operational mode, the L1 type flip-flops 1–3 are combined with the L2 type flip-flops 6–8 in the three stage shift register circuit configuration as previously explained. As is well known to those skilled in the art, the circuit is combined in a cascaded chain with other identical three stage shift register circuits, as previously explained, thereby allowing testing of, inter alia, the individual L1 type flip-flops of the resultant cascade shift register with the aforementioned LSSD testing technology fully disclosed, for example, in the LSSD references cited above, and hence omitted herein for sake of brevity. Briefly, however, by way of explanation, during testing the inputs of the circuit of FIG. 1 are used to condition the L1 type flip-flops 1–3 with fault effect test bit patterns, and the test patterns are scanned through the SRL stages of the cascade shift register with the scanning non-overlapping pulses of the scanning pulse train signals +A and +B CLOCKS, the scanning being referred to in the art as the scan mode. Each fault effect pattern is correlated with a particular one of the types of faults, e.g. a stuck-at-one (s-a-1), and with a particular one of the flip-flops 1–3.

By way of example, in one typical testing sequence, the fault effect test pattern is first applied on the inputs 9–12 with the clock signals at inputs 14, 14A–17 at their inactive levels and the input 13 being at a Don't Care level. The test pattern after a suitable settling out time period establishes input conditions at the particular one of the L1 type flip-flops 1–3 with which the pattern is correlated. Next, the particular one of the flip-flops 1–3 is clocked by the appropriate clock signal, i.e. +C CLOCK 1 for flip-flops 1 or 2 and +C CLOCK 2 for flip-flop 3, and as a result in the particular flip-flop there is stored information which will provide at its complementary outputs +L1 and −L1 an output bit pattern which is indicative of the absence of the particular fault for the particular flip-flop or an opposite output bit pattern which is indicative of the presence of the fault in the flip-flop. Next, the fault effect information stored in the particular one of the flip-flops 1–3 is further propagated through the composite shift register output by alternate scan clock pulses of the +B and +A CLOCK signals applied to terminals 15 and 14, respectively, the first +B CLOCK pulse shifting the information stored in the L1 type flip-flop to the next L2 type flip-flop connected to its output, the following +A CLOCK pulse shifting the information now stored in the last mentioned L2 type latch to the L1 type flop-flop of the next SRL stage, and so forth, until the fault effect information appears at the outputs +Q, −Q of the final stage of the composite shift register. Because the location of the particular SRL stage to which the fault effect information was originally propagated and stored is known relative to the location the final stage of the composite shift register, the number of alternate +A and +B CLOCK pulses required to shift the fault effect information from the particular SRL stage to the outputs of the final SRL stage is known and by means of a counter or the like can be tracked so that when the information reaches the outputs of the final SRL stage, the bit pattern at the outputs of the final SRL stage can be compared with a reference bit pattern that is indicative of the existence or absence of the fault condition at the original L1 type flip-flop.

Thus, in combination with the aforementioned principles of the present invention which provides the LSSD testable D-type edge-trigger-operable latch circuit apparatus with overriding set/reset asynchronous control, in accordance with still other principles of the present invention, the clock inputs 10, 14, 14A–17 are not interconnected thereby allowing the circuit of FIG. 1 to be interchangeably operable as the D-Type edge-triggered latch for normal, i.e. systems, operational purposes and as a three stage shift register for LSSD testing operational purposes. Thus, the circuit can be tested as many times as desired prior to and after its installation in the system of which it is a part allowing diagnosis of a fault or faults and/or repair or replacement thereof of the faulty unit and is particularly useful for in the field servicing of the system. Moreover, by not interconnecting the system clock input 10 and the clock inputs 16 and 17 of the circuit of FIG. 1, the inputs 16 and 17 can be commonly connected to their respective counterparts in the other identical edge-triggered latch circuits thereby minimizing the number of access inputs required to test the circuit apparatus and thus simplifying the interconnection and testing thereof.

In the preferred embodiment, the L1 type flip-flops have only one scan-in input −I and a pair of scanning clock inputs +A and −A, while the L2 type flip-flops have a pair of scan-in inputs +I and −I but only one scanning clock input +B, with the outputs +L1 and −L1 of a type 1 flip-flop being connected to the inputs +I and −I, respectively, of a L2 type flip-flop, and the output −L2 of a L2 type flip-flop being connected to the input −I of a L1 type flip-flop, and that accordingly only −SCAN IN, +A CLOCK, −A CLOCK, and +B CLOCK signals and only the output −SCAN OUT are used in the preferred embodiment. It should be understood, as will be appreciated by those skilled in the art, that the L1 and L2 type flip-flops could have other input/output configurations and connections and appropriate signals therefor. For example, the L1 type flip-flops could be modified to have a pair of scan-in inputs +I and −I and only one scanning clock input +A, and the L2 type flip-flops modified to have only one scanning input −I and a pair of scanning clock inputs +B and −B, with the output −L1 of a L1 type flip-flop being connected to the input −I of a L2 type flip-flop, and the outputs +L2 and −L2 of a L2 type flip-flop being connected to the inputs +I and −I, respectively, of a L1 type flip-flop, and that accordingly +SCAN IN, −SCAN IN, +A CLOCK, +B CLOCK and −B CLOCK signals and both the output +SCAN OUT and −SCAN OUT, corresponding to the +L2 and −L2 outputs of the flip-flop 8, are used.

Thus, while the invention has been described with reference to preferred embodiments thereof, it will be understood by those skilled in the art that various changes in form and details may be made without departing from the scope of the invention.

We claim:

1. LSSD testable latch circuit apparatus, said apparatus having systems operational and LSSD testing operational modes, said apparatus comprising:
 a first group of three flip-flops,
 a second group of three flip-flops, and
 circuit control means for selectively operating said first group of flop-flops as a D-type edge triggered latch during said systems operational mode and operating said first and second groups as a three-stage shift register during said LSSD testing operational mode.

2. LSSD testable latch circuit apparatus according to claim 1 wherein said D-type edge triggered latch is further asynchronously settable by said circuit control means in an override manner.

3. LSSD testable latch circuit apparatus according to claim 1 wherein said D-type edge triggered latch is further asynchronously resettable by said circuit control means in an override manner.

4. LSSD testable latch circuit apparatus according to claim 3 wherein said D-type edge triggered latch is further asynchronously settable by said circuit control means in an override manner.

5. LSSD testable latch circuit apparatus, said apparatus having systems operational and LSSD testing operational modes, said apparatus comprising:
 input means for receiving plural input signals, said input means having a systems data input terminal, a systems clock input terminal, a set input terminal, a reset input terminal, and first, second, third and fourth control clock input terminal means, and shift input terminal means,
 output means for providing plural output signals, said output means having a true output terminal, a complementary output terminal, and shift output terminal means,
 a first group of first, second and third flip-flops,
 a second group of fourth, fifth and sixth flip-flops, and
 circuit control means coupled to said input means, said circuit control means in response to a first set of said input signals at said input means operating said first group of flip-flops as a D-type edge triggered latch during said systems operational mode to provide said output signals at said true and complementary terminals with a bit pattern indicative of the information to be stored in said edge triggered latch, and said circuit control means in response to a second set of said input signals at said input means operating said first and second groups of flip-flpps as a three-stage shift register during said LSSD testing operational mode to store LSSD test information in said shift register and shift said LSSD test information through said shift register to said output means to provide said output signals at said true and complementary terminals with a bit pattern correlated with said LSSD test information.

6. LSSD testable latch circuit apparatus according to claim 5 wherein said D-type edge triggered latch is asynchronously settable by said circuit control means in an override manner in response to a third set of said input signals at said input means.

7. LSSD testable latch circuit apparatus according to claim 5 wherein said D-type edge triggered latch is asynchronously resettable by said circuit control means in an override manner in response to a fourth set of said input signals at said input means.

8. LSSD testable latch circuit apparatus according to claim 5 wherein
 each of said first, second and third flip-flops further comprises set control input means, reset control input means, first clock control input means, second clock control input means, and first shift control input means, and first outputs means,
 each of said fourth, fifth and sixth flip-flops further comprises second shift control input means, third clock control input means, and second output means, and
 said circuit control means further comprises first and second logic circuits,
 said first logic circuit having input connections to said systems data input terminal, said systems clock input terminal, said set input terminal and said reset input terminal, respectively, and further having first, second and third output control terminal means, said first output control terminal means being connected to said set and reset control input means of said first flip-flop, and said second output control terminal means being connected to said set and reset control input means of said second flip-flop,
 said second logic circuit having input connections to said systems clock input terminal, said respective first output means of said first and second flip-flops, and said third output control terminal means of said first logic circuit, respectively, and further having fourth output control terminal means connected to said set and reset control input means of said third flip-flop,
 said first shift control input means of said first flip-flop being connected to said shift input terminal means, said first output means of said first flip-flop being connected to said second shift control input means of said fourth flip-flop, said second output means of said fourth flip-flop being connected to said first shift control input means of said second flip-flop, said first output means of said second flip-flop being connected to said second shift control input means of said fifth flip-flop, said second output means of said fifth flip-flop being connected to said first shift control input means of said third flip-flop, said first output means of said third flip-flop being connected to said second shift control input means of said sixth flip-flop, said first output means of said third flip-flop being further connected to said true and complementary output terminals, said second output means of said sixth flip-flop being connected to said shift output terminal means, said first control clock input terminal means being connected commonly to said first clock control input means of said first, second and third flip-flops, said second control clock input terminal means being connected commonly to said second clock control input means of said first and second flip-flops, said third control clock input terminal means being connected to said second clock control input means of said third flip-flop, and said fourth control clock input terminal means being connected commonly to said third clock control input means of said fourth, fifth and sixth flip-flops.

9. Latch circuit apparatus according to claim 8 wherein said first logic circuit comprises first, second, third, fourth, fifth and sixth inverters, and first, second, third and fourth AND/INVERT gates and an OR/INVERT gate, and said second logic circuit comprises fifth, sixth, seventh and eighth AND/INVERT gates, each of said gates having a respective gate output and respective multiple gate inputs, said first inverter being connected between said systems data input terminal and one of said gate inputs of said second AND/INVERT gate, said second inverter being connected between said systems clock input terminal and commonly to a respective one of said gate inputs of said first AND/INVERT gate and another one of said gate inputs of said second AND/INVERT gate, said OR/INVERT gate having one of its said gate inputs connected to said set input terminal and another one of its gate inputs connected to said reset input terminal, and said gate output of said OR/INVERT gate being responsive to the input conditions at said gate inputs of said OR/INVERT gate, said first AND/INVERT gate having two others of its said gate inputs connected to said systems data input terminal, and said gate output of said OR/INVERT gate, respectively, said second AND/INVERT gate having still another one of its said gate inputs connected to said gate output of said OR/INVERT gate, said third AND/INVERT gate having one of its said gate inputs connected to said gate output of said second AND/INVERT gate and another one of its said gate inputs connected to said gate output of said OR/INVERT gate, and further having its said gate output connected to said reset control input means of said first flip-flop, said fourth AND/INVERT gate having one of its said gate inputs connected to said gate output of said first AND/INVERT gate and another one of its said gate inputs connected to said gate output of said OR/INVERT gate, and further having its said gate output connected to said reset control input means of said second flip-flop, said third inverter being connected between said gate output of said first AND/INVERT gate and said set control input means of said first flip-flop, said fourth inverter being connected between said gate output of said second AND/INVERT gate and said set control input means of said second flip-flop, said fifth AND/INVERT gate having one of its said gate inputs connected to said first output means of said first flip-flop, and having another one of its said gate input means connected to said systems clock input terminal, said sixth AND/INVERT gate having one of its said gate inputs connected to said first output means of said second flip-flop, and having another one of its said gate input means connected to said systems clock input terminal, said seventh AND/INVERT gate having one of its said gate inputs connected to said gate output of said fifth AND/INVERT gate, and having its gate output connected to said set control input means of said third flip-flop, said eighth AND/INVERT gate having one of its said gate inputs connected to said gate output of said sixth AND/INVERT gate, and having its gate output connected to said reset control input means of said third flip-flop, said fifth inverter being connected between said set input terminal and another one of said gate inputs of said seventh AND/INVERT gate, said sixth inverter being connected between said reset input terminal and another one of said gate inputs of said eighth AND/INVERT gate.

10. Latch circuit apparatus according to claim 9 wherein each of said first output means of said first, second and third flip-flops has true and complementary outputs, and each of the particular ones of said first, second and third flip-flops of said first group further comprises:

ninth, tenth, eleventh, twelfth and thirteenth AND/INVERT gates and a seventh inverter, each of said ninth to said thirteenth gates having a respective gate output and multiple gate inputs, said ninth AND/INVERT gate having one of its said gate inputs connected to said set control input means of the particular one of said flip-flops of said first group and another of its said gate inputs connected to said second clock control input means of said particular one of said flip-flops of said first group, said tenth AND/INVERT gate having one of its said gate inputs connected to said reset control input means of said particular one of said flip-flops of said first group and another of its said gate inputs connected to its said second clock control input means of said particular one of said flip-flops of said first group, said eleventh AND/INVERT gate having one of its said gate inputs connected to said gate output of said ninth gate, another one of its said gate inputs connected to said complementary output of said particular one of said flip-flops of said first group, and its said gate output connected to said true output of said particular one of said flip-flops of said first group, said twelfth AND/INVERT gate having one of its said gate inputs connected to said gate output of said tenth gate, another one of its said gate inputs connected to said true output of said particular one of said flip-flops of said first group, and still another one of its gate inputs connected to said first clock control input means of said particular one of said flip-flops of said first group, and its said gate output connected to said complementary output of said particular one of said flip-flops of said first group, said seventh inverter being connected between said shift control input means of said particular one of said flip-flops of said first group and one of said gate inputs of said thirteenth AND/INVERT gate, said thirteenth AND/INVERT gate having another one of its said gate inputs connected to said first clock control input means of said particular one of said flip-flops of said first group, and it said gate output connected to said complementary output of said particular one of said flip-flops of said first group, said respective gate outputs of said twelfth and thirteenth gates being And-dot connected at said complementary output of said particular one of said flip-flops of said first group.

11. Latch circuit apparatus according to claim 10 wherein each of said second shift input means of said fourth, fifth and sixth flip-flops has first and second shift inputs, each of said second output means of said fourth, fifth and sixth flip-flops has true and complementary outputs, and each of the particular ones of said fourth, fifth and sixth flip-flops of said second group further comprises:

four AND/INVERT gates, each of said four AND/INVERT gates having a respective gate output and multiple gate inputs, one of said four And/INVERT gate Anding one of its said gate inputs connected to said first shift input of the particular one of said second shift control input means of the particular one of said flip-flops of said second group with another one of its gate inputs connected to said third clock control input means of said particular one of said flip-flops of said second group, and having its said gate output responsive to the input conditions at said third clock control input means and said first shift input of said particular one of said flip-flops of said second group, a different one of said four AND/INVERT gates Anding one of its said gate inputs connected to said second shift input of said particular one of said second shift control input means of said particular one of said flip-flops of said second group with another one of its gate inputs connected to said third clock control input means of said particular one of said flip-flops of said second group, and having its said gate output responsive to the input conditions at said third clock control input means and said second shift input of said particular one of said flip-flops of said second group, another different one of said four AND/INVERT gates having one of its said gate inputs connected to the particular said gate output that is responsive to said input conditions at said third clock control input means and said first shift input of said particular one of said flip-flops of said second group, and its said gate output connected to said true output of said particular one of said flip-flops of said second group, the remaining one of said four AND/INVERT gates having one of its said gate inputs connected to the particular said gate output that is responsive to said input conditions at said third clock control input means and said second shift input of said particular one of said flip-flops of said second group, and its said gate output is connected to said complementary output of said particular one of said flip-flops of said second group, and said another different one and said remaining one of said four AND/INVERT gates of the particular one of said flip-flops of said second group having their respective said gate outputs cross-coupled connected to respective different ones of their said gate inputs.

12. Latch circuit apparatus according to claim 10 wherein each of said second shift input means of said fourth, fifth and sixth flip-flops has first and second shift inputs, each of said second output means of said fourth, fifth and sixth flip-flops has true and complementary outputs, and each of the particular ones of said fourth, fifth and sixth flip-flops of said second group further comprises:

two AND/OR/INVERT gates, each of said two AND/OR/INVERT gates having a gate output and two pairs of gate inputs, one of said two AND/OR/INVERT gates having its gate inputs of one of its said two pairs of gate inputs AND connected to said first shift input and said thick clock control input means, respectively, of the particular one of the flip-flops of the second group, and having its said gate output connected to said complementary output of said particular one of the flip-flops of the second group, the other one of said two AND/OR/INVERT gates having its gate inputs of one of its said two pairs of gate inputs AND connected to said second shift input and said third clock control input means, respectively, of the particular one of the flip-flops of the second group, and having its said gate output connected to said true output of said particular one of the flip-flops of the second group, said two AND/OR/INVERT gates of said particular one of the flip-flops of said second group having their respective said gate outputs cross-coupled connected to their respective other pairs said gate inputs.

13. Latch circuit apparatus according to claim 9 wherein each of said first output means of said first, second and third flip-flops has true and complementary outputs, and each of the particular ones of said first, second and third flip-flops of said first group further comprises:

a ninth AND/INVERT gate and first and second AND/OR/INVERT gates, each of said ninth AND/INVERT and said first and second AND/OR/INVERT gates having a respective gate output and multiple gate inputs, said ninth AND/INVERT gate having one of its said gate inputs connected to said reset control input means of the particular one of said flip-flops of said first group and another of its said gate inputs connected to said second clock control input means of said particular one of said flip-flops of said first group, said first AND/OR/INVERT gate Anding a pair of its said gate inputs connected to said set control input means and said second clock control input means, respectively, of said particular one of said flip-flops of said first group, Anding another pair of its said gate inputs, said another pair being commonly connected to said true output of said particular one of said flip-flops of said first group, and its said gate output being connected to said complementary output of said particular one of said flip-flops of said first group, said second AND/OR/INVERT gate Anding a pair of its said gate inputs connected to first shift control input means and said first clock control input means, respectively, of said particular one of said flip-flops of said first group, Anding still another pair of its said gate inputs connected to said first clock control input means of said particular one of said flip-flops of said first group and said gate output of said first AND/OR/INVERT gate, respectively, and having its said gate output connected to said true output of said particular one of said flip-flops of said first group, said respective gate outputs of said ninth AND/INVERT and said second AND/OR/INVERT gates being And-dot connected at said true output of said particular one of said flip-flops of said first group.

14. Latch circuit apparatus according to claim 13 wherein each of said second shift input means of said fourth, fifth and sixth flip-flops has first and second shift inputs, each of said second output means of said fourth, fifth and sixth flip-flops has true and complementary outputs, each of the particular ones of said fourth, fifth and sixth flip-flops of said second group further comprises:

four AND/INVERT gates, each of said four AND/INVERT gates having a respective gate output and multiple gate inputs, one of said four And/INVERT gates Anding one of its said gate inputs connected to said first shift input of the particular one of said second shift control input means of the particular one of said flip-flops of said second group with another one of its gate inputs connected to said third clock control input means of said particular one of said flip-flops of said second group, and having its said gate output responsive to the input conditions at said third clock control input means and said first shift input of said particular one of said flip-flops of said second group, a different one of said four AND/INVERT gates Anding one of its said gate inputs connected to said second shift input of said particular one of said second shift control input means of said particular one of said flip-flops of said second group with another one of its gate inputs connected to said third clock control input means of said particular one of said flip-flops of said second group, and having its said gate output responsive to the input conditions at said third clock control input means and said second shift input of said particular one of said flip-flops of said second group, another different one of said four AND/INVERT gates having one of its said gate inputs connected to the particular said gate output that is responsive to said input conditions at said third clock control input means and said first shift input of said particular one of said flip-flops of said second group, and its said gate output connected to said true output of said particular one of said flip-flips of said second group, the remaining one of said four AND/INVERT gates having one of its said gate inputs connected to the particular said gate output that is responsive to said input conditions at said third clock control input means and said second shift input of said particular one of said flip-flops of said second group, and its said gate output is connected to said complementary output of said particular one of said flip-flips of said second group, and said another different one and said remaining one of said four AND/INVERT gates of the particular one of said flip-flops of said second group having their respective said gate outputs cross-coupled connected to respective different ones of their said gate inputs.

15. Latch circuit apparatus according to claim 13 wherein each of said second shift input means of said fourth, fifth and sixth flip-flops has first and second shift inputs, each of said second output means of said fourth, fifth and sixth flip-flops has true and complementary outputs, and each of the particular ones of said fourth, fifth and sixth flip-flops of said second group further comprises:

two AND/OR/INVERT gates, each of said two AND/OR/INVERT gates having a gate output and two pairs of gate inputs, one of said two AND/OR/INVERT gates having its gate inputs of one of its said two pairs of gate inputs AND connected to said first shift input and said third clock control input means, respectively, of the particular one of the flip-flops of the second group, and having its said gate output connected to said complementary output of said particular one of the flip-flops of the second group, the other one of said two AND/OR/INVERT gates having its gate inputs of one of its said two pairs of gate inputs AND connected to said second shift input and said third clock control input means, respectively, of the particular one of the flip-flops of the second group, and having its said gate output connected to said true output of said particular one of the flip-flops of the second group, said two AND/OR/INVERT gates of said particular one of the flip-flops of said second group having their respective said gate outputs cross-coupled connected to their respective other pairs said gate inputs.

* * * * *